United States Patent

Paletto

[11] 4,125,740
[45] * Nov. 14, 1978

[54] RESIN-ENCASED MICROELECTRONIC MODULE

[75] Inventor: Raimondo Paletto, Milan, Italy

[73] Assignee: SGS-ATES Componenti Elettronici S.p.A., Milan, Italy

[*] Notice: The portion of the term of this patent subsequent to Jun. 28, 1994, has been disclaimed.

[21] Appl. No.: 808,371

[22] Filed: Jun. 20, 1977

Related U.S. Application Data

[63] Continuation of Ser. No. 671,374, Mar. 29, 1976, Pat. No. 4,059,810, which is a continuation-in-part of Ser. No. 508,951, Sep. 23, 1974, Pat. No. 4,032,706.

[30] Foreign Application Priority Data

Sep. 26, 1973 [IT] Italy ................................ 29390 A/73

[51] Int. Cl.² ............................................. H05K 5/00
[52] U.S. Cl. ........................... 174/52 PE; 174/52 FP; 357/70; 357/72
[58] Field of Search ............. 174/52 PE, 52 FP, 52 S; 357/68–70, 72, 73; 29/626, 627, 588–591

[56] References Cited

U.S. PATENT DOCUMENTS

| | | | |
|---|---|---|---|
| 3,368,114 | 2/1968 | Campbell et al. | 357/70 X |
| 3,416,348 | 12/1968 | Carter, Jr. et al. | 174/52 FP X |
| 3,437,945 | 4/1969 | Duncan | 330/267 |
| 3,478,420 | 11/1969 | Grimes et al. | 357/70 X |
| 3,500,219 | 3/1970 | Rhodes | 330/290 |
| 3,606,673 | 9/1971 | Overman | 357/70 X |
| 3,629,672 | 12/1971 | Van de Water | 174/52 PE X |
| 3,828,265 | 8/1974 | Romano | 330/307 X |
| 3,839,782 | 10/1974 | Lincoln | 29/591 X |

Primary Examiner—Elliot A. Goldberg
Assistant Examiner—D. A. Tone
Attorney, Agent, or Firm—Karl F. Ross

[57] ABSTRACT

A metal plate carrying a semiconductive chip with a five-terminal power amplifier is encased in a prismatic resinous body having five tongues projecting from one side thereof, the central tongue being grounded to the plate while the other four are attached to various terminals of the chip. The projecting portions of the five tongues are alternately bent angularly in opposite directions to increase the separation of their free ends. During assembly, a connector strip bearing a number of five-tongue groups is fitted onto a support strip, divided into as many plate sections, by inserting a bent-over extremity of the central tongue of each group, provided with an enlarged head, into a recess of a confronting plate section preparatorily to encasement.

7 Claims, 16 Drawing Figures

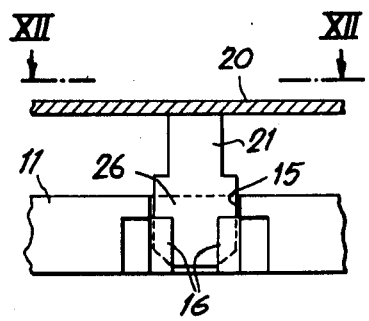
FIG. 11
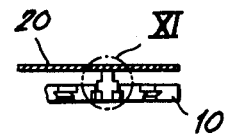
FIG. 10
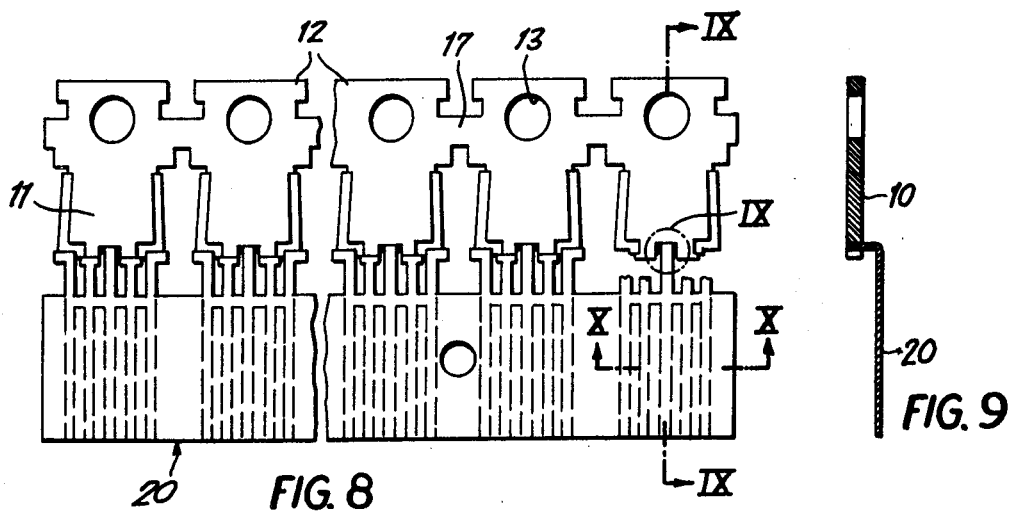
FIG. 8
FIG. 9
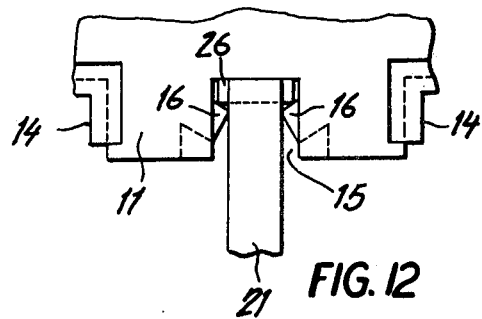
FIG. 12

RESIN-ENCASED MICROELECTRONIC MODULE

CROSS-REFERENCE TO RELATED APPLICATION

This is a continuation of application Ser. No. 671,374, filed Mar. 29, 1976, now U.S. Pat. No. 4,059,810 which is a continuation-in-part of application Ser. No. 508,951 filed Sept. 23, 1974, now U.S. Pat. No. 4,032,706.

FIELD OF THE INVENTION

My present invention relates to a microelectronic module of the type wherein a semiconductive chip, i.e. a transistor or some other piece of integrated circuitry, is encased in a block-shaped thermoplastic body together with a set of conductive tongues which partly project from that body to serve as external leads connected to various terminals of the chip. A metal plate supporting the chip has an exposed underside with which it comes to rest on a larger metallic structure acting as a heat sink.

BACKGROUND OF THE INVENTION

In the manufacture of such modules it is customary to provide a conductive lead frame which is subsequently split into a multiplicity of sections each forming a chip-supporting plate along with an associated set of tongues, at least one tongue being rigid with the plate and being initially connected with the remaining tongues by severable bridges. The number of tongues on each lead-frame section is limited by mechanical as well as electrical considerations; where a large number of such tongues is required, two symmetrical tongue arrays may be provided on opposite sides of the block in a so-called dual-in-line arrangement (see, for example, commonly owned U.S. Pat. No. 3,689,683).

Thus, a standardized lead frame particularly designed for use with low-voltage power transistors comprises three tongues per section, i.e. a central tongue integral with the plate and two flanking tongues detachable therefrom; such a lead frame is commercially available under the designation TO-220 and operates with a temperature rise of about 3° C. per watt.

OBJECTS OF THE INVENTION

The general object of my present invention is to provide an improved microelectronic module of this character in which the number of tongues projecting from the resin body in substantially increased.

A more specific object is to provide a module in which a power amplifier is served by five tongues projecting from one side of the surrounding resin block.

SUMMARY OF THE INVENTION

According to my invention, a set of conductive tongues projecting from a synthetic-resin body encasing a semiconductive chip, specifically a five-terminal power amplifier, includes a central tongue conductively and mechanically secured to a chip-supporting plate within that body, a pair of intermediate tongues flanking the central tongue, and a pair of outer tongues flanking the intermediate tongues, the intermediate and outer tongues being directly connected to respective terminals of the chip. The projecting portions of these tongues extend generally parallel to one another from a side of the resinous body and are alternately bent upwardly and downwardly outside that body to increase the spacing of their free ends.

In a specific instance, the power amplifier comprises two pairs of cascaded transistors with two discrete input terminals, a d-c supply terminal, a common output terminal and a ground terminal, the latter being constituted by the supporting plate.

BRIEF DESCRIPTION OF THE DRAWINGS

The above and other features of my invention will now be described in detail with reference to the accompanying drawing in which:

FIG. 8 is a face view of a lead frame composed of the strips of FIGS. 1-7, prior to partial separation of its tongues;

FIG. 9 is a cross-sectional view taken on the line IX — IX of FIG. 8;

FIG. 10 is a fragmentary sectional view taken on the line X — X of FIG. 8;

FIG. 11 is an enlargement of the area XI of FIG. 10;

FIG. 12 is a face view of the fragment visible in FIG. 11 as seen from the line XII — XII thereof;

SPECIFIC DESCRIPTION

Figure 3:
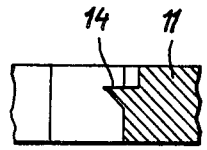
FIG. 3 is an enlargement of the area III of FIG. 2.
Figure 2:
FIG. 2 is a fragmentary sectional view taken on the line II — II of FIG. 1.
Figure 1:
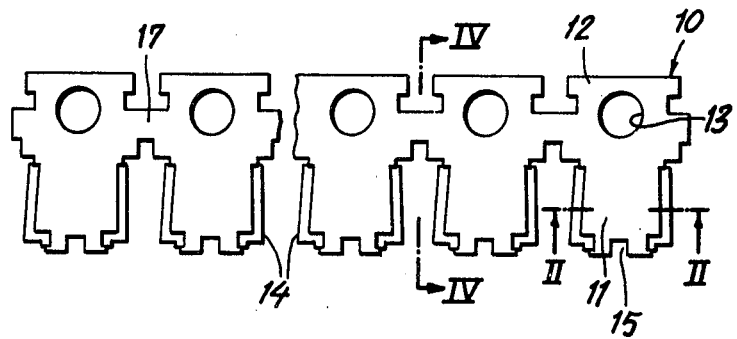
FIG. 1 is a face view of a support strip used in the manufacture of microelectronic modules according to my invention.
Figure 4:
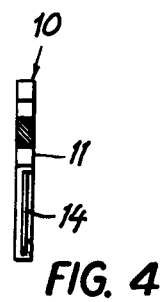
FIG. 4 is a cross-sectional view taken on the line IV — IV of FIG. 1.

In FIGS. 1-4 I have shown a support strip 10 of sheet metal divided into a multiplicity of identical sections, each section comprising a plate 11 having a rearward extension 12 provided with a mounting hole 13. Edges 14 of plate 11 are chamfered, as best seen in FIG. 3, for firm anchorage in a body of synthetic resin to be subsequently cast therearound. A front edge of plate 11 is centrally recessed at 15 for a purpose to be described.

Figure 5:
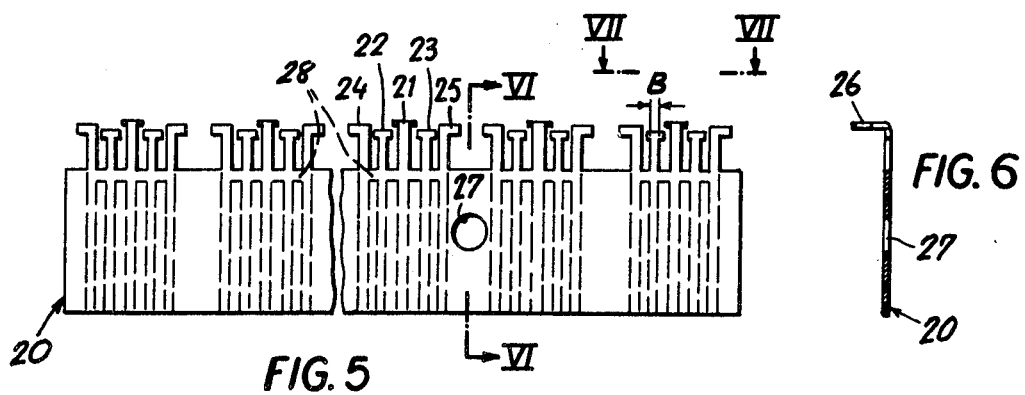
FIG. 5 is a face view of a connector strip to be fitted onto the support strip of FIGS. 1-4 in making a lead frame.
Figure 6:
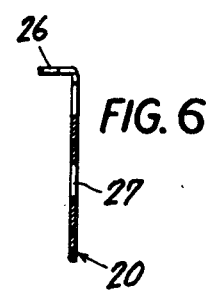
FIG. 6 is a cross-sectional view taken on the line VI — VI of FIG. 5.
Figure 7:
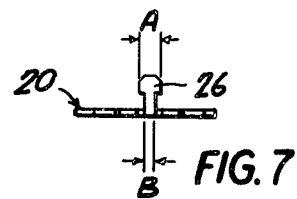
FIG. 7 is a fragmentary edge view as seen from the line VII — VII of FIG. 5.

FIGS. 5-7 show an associated connector strip 20 divided into a multiplicity of conductor sections, one for each section of support strip 10. Each section of strip 20 is formed with five parallel tongues, i.e. a central tongue 21, a pair of intermediate tongues 22, 23, and a pair of outer tongues 24, 25. Central tongue 21, which is longer than the others, is bent over at its end facing the strip 10, this end forming an enlarged head 26 (best seen in FIG. 7) whose width A substantially exceeds the width B of its stem. Initially, as shown in FIG. 5, the major portions of these tongues form part of a solid sheet provided with mounting holes 27 (only one shown) whereby the two strips 10 and 20 may be fixed to a common base in precise mutual alignment to form a lead frame; this has been illustrated in FIGS. 9-12.

Figure 16:
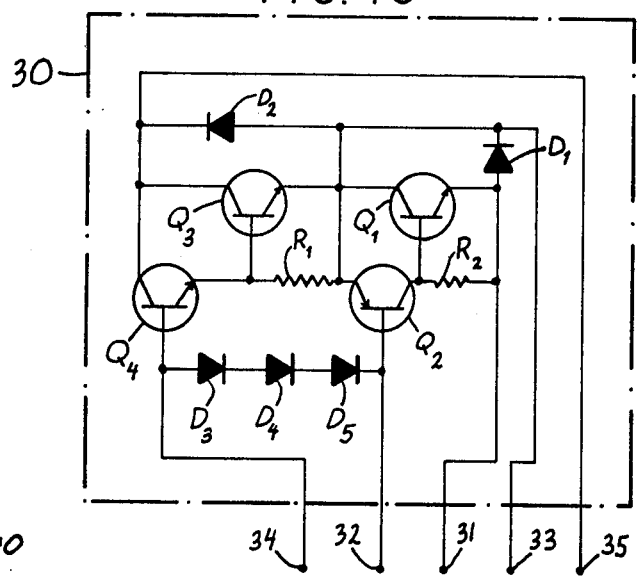
FIG. 16 is a circuit diagram of a power amplifier included in the module of FIGS. 13-15.
Figure 13:
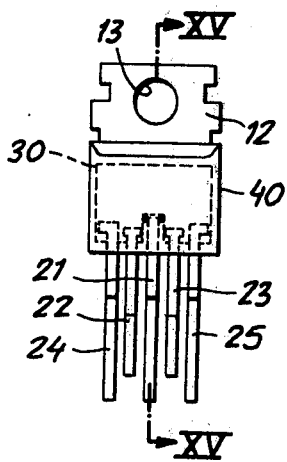
FIG. 13 is a face view of a complete module including a section cut from the lead frame of FIGS. 8—12.

Upon the juxtaposition of strips 10 and 20, the heads 26 of tongues 21 are inserted from above into the corresponding recesses 15 of the confronting plate sections and are locked in place by a deformation of the sides of each recess to produce a pair of teeth 16 as best seen in FIG. 12. For a firmer mechanical and electrical connection, the tongue head 26 may then be soldered onto the plate 11. The tongues can now be cut from the sheet, along dashed lines shown in FIGS. 5 and 8, with narrow bridges 28 left standing between the tongues of each set or group 21-25. Either before or after this partial separation, a semiconductive chip 30 (see FIGS. 13 and 15) is placed on each plate 11; as here specifically contemplated, this chip is a power amplifier with a ground lead 31 and four terminals 32-35 (FIG. 16) to which the proximal ends of tongues 22-25 are then soldered. It will be noted that the ends of intermediate tongues 22, 23 are T-shaped whereas those of the outer tongues 24, 25 are L-shaped with outwardly pointing transverse legs, these ends being also offset from one another inasmuch as tongues 22 and 23 are shorter than tongues 24 and 25.

Next, the chip and the proximal tongue ends of each section are encased in a body 40 of thermoplastic material which also envelops the plate 11 from the top, the front and its two sides; the underside of the plate is left exposed and its extension 12 projects rearwardly from the body 40. Mounting hole 13, of which there is one from each section, can subsequently be used to fasten the resulting module to a thermally conductive base also serving as an electrical ground for the chip 30 and the tongue 21.

Figure 14:
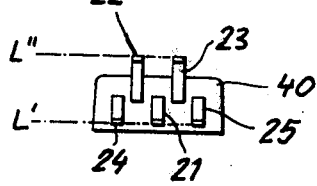
FIG. 14 is an end view of the module shown in FIG. 13.
Figure 15:
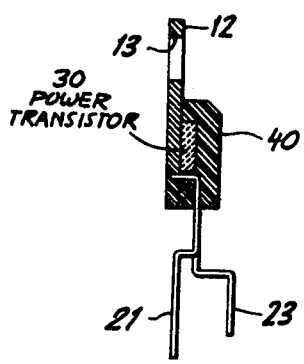
FIG. 15 is a cross-sectional view taken on the line XV — XV of FIG. 13.

Following encasement, and either before or after the severance of links 17 by which the exposed plate extensions 12 are initially interconnected, the projecting poritons of tongues 21-25 are angularly bent, alternately in opposite directions, to increase the spacing of their free ends as best seen in FIG. 15. Tongues 21, 24 and 25 are pent perpendicularly downwardly (as viewed in FIG. 14) whereas tongues 22 and 23 are bent perpendicularly upwardly, their extremities being then again bent at right angles so as to come to lie at two different levels $L'$ and $L''$.

The power amplifier of chip 30 is shown to comprise two pairs of cascaded transistors $Q_1$, $Q_2$ and $Q_3$, $Q_4$, transistor $Q_2$ being of PNP type while the others are of NPN type. Terminals 32 and 34 are connected to the bases of first-stage transistors $Q_2$ and $Q_4$, respectively, whose emitters are interconnected by a resistor $R_1$; the collector of transistor $Q_2$ is grounded via a resistor $R_2$; ground lead 31 being directly tied to the emitter of transistor $Q_1$. Terminal 35 supplies positive driving voltage to the collectors of transistors $Q_3$ and $Q_4$. The emitter of transistor $Q_3$ and the collector of transistor $Q_1$ form a common junction with output terminal 33, the emitter-collector paths of these two transistors being bridged by respective diodes $D_1$ and $D_2$. Three further diodes $D_3$, $D_4$, $D_5$ are serially connected between terminals 32 and 35 as an input resistance.

It will thus be seen that I have provided a structure and a method enabling a semiconductive chip to be fitted with five tongues 21-25, projecting generally parallel from an edge of a surrounding synthetic-resin block 40, so as to enable the necessary connections to the power amplifier to be established without the need for a dual-in-line conductor arrangement.

I claim:

1. A microelectronic module comprising:

a sheet-metal plate with an upper and a lower face;

a semiconductive chip supported on the upper face of said plate;

a set of conductive tongues including a central tongue conductively and mechanically secured to said plate, a pair of intermediate tongues flanking said central tongue, and a pair of outer tongues flanking said intermediate tongues, said intermediate and outer tongues being connected to respective terminals of said chip; and a resinous body encasing said chip and three sides of said plate while leaving the lower face thereof exposed, said tongues being partly imbedded in said body and having portions projecting generally parallel to one another from a side of said body, the projecting portions of said central and outer tongues lying in a first plane, the projecting portions of said intermediate tongues lying in a second plane substantially parallel to but offset from said first plane whereby the spacing of the free ends of adjacent tongues is greater than that of the imbedded parts thereof;

said plate having an edge confronting said tongues and forming an upwardly open median recess, said central tongue having a downwardly bent encased extremity received in said recess, said intermediate tongues having T-shaped encased ends offset from said encased extremity, said outer tongues having outwardly pointing L-shaped encased ends offset from said T-shaped ends.

2. A module as defined in claim 1 wherein said planes are substantially parallel to said faces.

3. A module as defined in claim 1 wherein said encased extremity is provided with a laterally enlarged head contacting the lateral edges of said recess.

4. A module as defined in claim 1 wherein said plate has an exposed rearward extension provided with a mounting aperture.

5. A module as defined in claim 1 wherein said projecting partitions are bent vertically in opposite directions and horizontally at different levels.

6. A module as defined in claim 1, further comprising a five-terminal power amplifier in the form of a semiconductive chip supported on said upper face, one of the terminals of said amplifier being constituted by said plate, the encased ends of said intermediate and outer tongues being respectively connected to the other four terminals of said amplifier.

7. A module as defined in claim 6 wherein said amplifier comprises two pairs of cascaded transistors with ground connections to said plate, said other four terminals including a separate input terminal for each of said pairs, a common output terminal and a d-c supply terminal.

* * * * *